US011217307B2

(12) United States Patent
Vianello et al.

(10) Patent No.: US 11,217,307 B2
(45) Date of Patent: Jan. 4, 2022

(54) CIRCUIT AND METHOD FOR PROGRAMMING RESISTIVE MEMORY CELLS

(71) Applicants: Commissariat á l'Energie Atomique et aux Energies Alternatives, Paris (FR); THE BOARD OF TRUSTEES OF THE LELAND STANFORD JUNIOR UNIVERSITY, Stanford, CA (US)

(72) Inventors: Elisa Vianello, Grenoble (FR); Etienne Nowak, Grenoble (FR); Binh Quang Le, San Jose, CA (US); Subhasish Mitra, Menlo Park, CA (US); Fan Tony Wu, Redwood City, CA (US); Philip Wong, Stanford, CA (US)

(73) Assignees: Commissariat à l'Energie Atomique et aux Energies Alternatives, Paris (FR); The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/733,715

(22) PCT Filed: Apr. 5, 2019

(86) PCT No.: PCT/IB2019/000432
§ 371 (c)(1),
(2) Date: Oct. 2, 2020

(87) PCT Pub. No.: WO2019/193423
PCT Pub. Date: Oct. 10, 2019

(65) Prior Publication Data
US 2021/0035638 A1 Feb. 4, 2021

Related U.S. Application Data

(60) Provisional application No. 62/653,398, filed on Apr. 5, 2018.

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 2213/79* (2013.01)

(58) Field of Classification Search
CPC .............. G11C 13/0069; G11C 13/004; G11C 2213/79
(Continued)

(56) References Cited

U.S. PATENT DOCUMENTS 7,940,552 B2 * 5/2011 Chang-Wook .......... G11C 11/56
365/163
9,613,693 B1 4/2017 Kamalanathan
(Continued)

OTHER PUBLICATIONS

International Search Report for International Application No. PCT/IB2019/000432 dated Sep. 17, 2019, 2 pages.
(Continued)

*Primary Examiner* — Vu A Le
(74) *Attorney, Agent, or Firm* — Moreno IP Law LLC (57) ABSTRACT

The present disclosure relates to a method of programming resistive memory cells of a resistive memory, the method comprising: applying, by a programming circuit based on a first target resistive state, an initial resistance modification to a first cell of the resistive memory to change its resistance from an initial resistive state to a first new resistance; comparing, by the programming circuit, the first new resistance of the first cell with a resistance range of the first target resistive state and with a target resistance range associated with the first target resistive state; and if it is determined that the first new resistance is outside the resistance range of the target resistive state and inside the target resistance range, applying by the programming circuit one or more further
(Continued)

resistance modifications to the first cell to increase or decrease its resistance.

15 Claims, 5 Drawing Sheets

(58) Field of Classification Search
USPC .......................................................... 365/148
See application file for complete search history.

(56) References Cited

U.S. PATENT DOCUMENTS

| | | | |
|---|---|---|---|
| 2004/0114429 A1* | 6/2004 | Ehiro | G11C 13/0007 365/158 |
| 2009/0109728 A1 | 4/2009 | Maejima et al. | |
| 2013/0033919 A1 | 2/2013 | Kim | |
| 2014/0153326 A1* | 6/2014 | Wang | G11C 13/004 365/163 |

OTHER PUBLICATIONS

W. Chien et al., "Multi-level 40nm WOX resistive memory with excellent reliability," 2011 International Electron Devices Meeting, Washington, DC, 2011, pp. 31.5.1-31.5.4.

A. Grossi et al., "Fundamental variability limits of filament-based RRAM," 2016 IEEE International Electron Devices Meeting (IEDM), San Francisco, CA, 2016, pp. 4.7.1-4.7.4.

B. Q. Le et al., "Resistive RAM With Multiple Bits Per Cell: Array-Level Demonstration of 3 Bits Per Cell," IEEE Transactions on Electron Devices, vol. 66, No. 1, pp. 641-646, Jan. 2019.

A. Prakash, J. Park, J. Song, J. Woo, E. Cha and H. Hwang, "Demonstration of Low Power 3-bit Multilevel Cell Characteristics in a TaOx-Based RRAM by Stack Engineering," in IEEE Electron Device Letters, vol. 36, No. 1, pp. 32-34, Jan. 2015.

F. M. Puglisi, C. Wenger and P. Pavan, "A Novel Program-Verify Algorithm for Multi-Bit Operation in HfO2 RRAM," in IEEE Electron Device Letters, vol. 36, No. 10, pp. 1030-1032, Oct. 2015.

S. Sheu et al., "A 5ns fast write multi-level non-volatile 1 K bits RRAM memory with advance write scheme," 2009 Symposium on VLSI Circuits, Kyoto, Japan, 2009, pp. 82-83.

S. Stathopoulos et al., "An Electrical Characterisation Methodology for Benchmarking Memristive Device Technologies," Sci Rep 9, 19412 (2019).

* cited by examiner

CIRCUIT AND METHOD FOR PROGRAMMING RESISTIVE MEMORY CELLS

FIELD

The present disclosure relates generally to the field of non-volatile memories, and in particular to a circuit and method for programming resistive memory cells.

BACKGROUND

Certain non-volatile memories are based on memory cells having variable resistance elements that are programmable to adopt one of a plurality of different resistive states. The programmed resistive state is maintained when the supply voltage of the memory cell is disconnected, and thus data can be stored in a non-volatile fashion.

Various types of variable resistance elements have been proposed, some of which are capable of being programmed by the level of a voltage and/or current applied across their terminals. Examples of RRAM (resistive random-access memory) comprising such programmable resistive elements include OxRAM (Oxide Random Access Memory), PC-RAM (Phase Change Random Access Memory) and CBRAM (conductive bridging RAM).

A variable resistance element programmable to have either a low or high resistance state is capable of storing a single bit of data. To program a memory formed of such resistive elements, it is sufficient that the resistances of all of the cells programmed to have the low resistance state are below a given threshold, and the resistances of all of the cells programmed to have the high resistance state are above the given threshold, such that the low and high resistive states can be distinguished from each other during the read operation. However, existing programming techniques tend to be relatively slow and/or lack energy efficiency.

Furthermore, in order to provide relatively high data storage densities, it has been proposed to provide resistive memories capable of multi-bit per cell storage. This implies programming each of the variable resistance elements to have one of S resistive states, where S is greater than 2, and generally equal to a power of 2. Such a programming operation should be relatively precise. However, existing solutions for programming multi-bit per cell memories tend to be inadequate in terms of speed, accuracy and/or energy efficiency.

SUMMARY

According to a first aspect, there is provided a method of programming resistive memory cells of a resistive memory, the method comprising:
a) applying, by a programming circuit based on a first target resistive state, an initial resistance modification to a first cell of the resistive memory to change the resistance of the first cell from an initial resistive state to a first new resistance;
b) comparing, by the programming circuit, the first new resistance of the first cell with a resistance range of the first target resistive state defined by a high and/or low resistance threshold;
c) comparing, by the programming circuit, the first new resistance of the first cell with a target resistance range associated with the first target resistive state and defined by a high and/or low resistance threshold; and
d) if it is determined that the first new resistance is outside the resistance range of the first target resistive state and inside the target resistance range, applying by the programming circuit one or more further resistance modifications to the first cell to increase or decrease its resistance.

According to one embodiment, the method comprises:
if the first new resistance is below the resistance range of the target resistive state, applying by the programming circuit in step d) at least one further resistance modification to the first cell to increase its resistance; and
if the first new resistance is above the resistance range of the target resistive state, applying by the programming circuit at least one further resistance modification to the first cell to reduce its resistance.

According to one embodiment, each of the one or more further resistance modifications modifies the resistance of the first cell by less than:
half the difference between the low threshold of the target resistance range and the low resistance threshold of the target resistive state; or
half the difference between the high resistance threshold of the target resistive state and the high threshold of the target resistance range.

According to one embodiment, the initial resistance modification modifies the resistance of the first cell by more than:
half the difference between the low threshold of the target resistance range and the low resistance threshold of the target resistive state; or
half the difference between the high resistance threshold of the target resistive state and the high threshold of the target resistance range.

According to one embodiment, if the first new resistance is within the resistance range of the target resistive state, no further resistance modification is applied to the first cell.

According to one embodiment, the first cell comprises a first variable resistance element coupled in series with a first transistor, and wherein applying, by the programming circuit, the initial resistance modification to the first cell comprises:
applying a first programming voltage across the first variable resistance element; and
applying a control voltage at a first level to the first transistor, the first level being selected based on the first target resistive state.

According to one embodiment, the method comprises applying by the programming circuit, in operation d), at least one further resistance modification to the first cell by applying a second programming voltage across the first variable resistance element, the second programming voltage being at a different level to the first programming voltage.

According to one embodiment, the resistance range of the first target resistive state is defined by the high resistance threshold and the low resistance threshold, and the target resistance range is defined by the high threshold and the low threshold, the low resistance threshold of the target resistive state being higher than the low threshold of the target range and the high threshold of the target resistance range being higher than the high resistance threshold of the target resistive state.

According to one embodiment, the low resistance threshold of the first target resistive state is at least 10 percent higher than the low threshold of the target resistance range, and the high threshold of the target resistance range is at least 10 percent higher than the high resistance threshold of the first target resistive state.

According to one embodiment, the method further comprises:

e) applying, by the programming circuit based on a second target resistive state, an initial resistance modification to a second cell of the resistive memory to change its resistance from the initial resistive state to a second new resistance;

f) comparing, by the programming circuit, the second new resistance of the second cell with a second resistance range of the second target resistive state defined by a high and/or low resistance threshold;

g) comparing, by the programming circuit, the second new resistance of the second cell with a second target resistance range associated with the second target resistive state and defined by high and/or low resistance thresholds; and h) if it is determined that the second new resistance is outside the resistance range of the second target resistive state and inside the second target resistance range, applying by the programming circuit one or more further resistance modifications to the second cell to increase or decrease its resistance.

According to one embodiment, the second cell comprises a second variable resistance element coupled in series with a second transistor, and wherein applying, by the programming circuit, the initial resistance modification to the second cell comprises applying a control voltage at a second level to the second transistor, the second level being different from the first level and being selected based on the second target resistive state.

According to one embodiment, the method further comprises:

determining that the first new resistance of the first cell is outside the first target resistance range and repeating the initial resistance modification; and determining that the second new resistance of the second cell is outside the second target resistance range, and applying a further initial resistance modification.

According to a further aspect, there is provided a programming circuit for programming resistive memory cells of a resistive memory, the programming circuit being configured to:

a) apply, based on a first target resistive state, an initial resistance modification to a first cell of the resistive memory to change the resistance of the first cell from an initial resistive state to a first new resistance;

b) compare the first new resistance of the first cell with a resistance range of the first target resistive state defined by a high and/or low resistance threshold;

c) compare the first new resistance of the first cell with a target resistance range associated with the first target resistive state and defined by a high and/or low resistance threshold; and d) if it is determined that the first new resistance is outside the resistance range of the first target resistive state and inside the target resistance range, apply one or more further resistance modifications to the first cell to increase or decrease its resistance.

A resistive memory comprising:
an array of cells; and
the above programming circuit configured to program the cells of the array.

According to one embodiment, the cells of the array are each programmable to store a plurality of bits using three of more resistive states.

According to a further aspect, there is provided a method of programming resistive memory cells of a resistive memory, the method comprising:

a) applying, by a programming circuit based on a target resistive state, an initial resistance modification to a first cell of the resistive memory to change the resistance of the first cell from an initial resistive state to a first new resistive state;

b) comparing, by the programming circuit, the first new resistance of the first cell with a first resistance range of the first target resistive state, the first resistance range being defined by low and high resistance thresholds;

c) if the first new resistance is below the low resistance threshold, applying by the programming circuit at least one further resistance modification to the first cell to increase its resistance; and d) if the first new resistance is above the high resistance threshold, applying by the programming circuit at least one further resistance modification to the first cell to reduce its resistance.

According to yet a further aspect, there is provided a programming circuit for programming resistive memory cells of a resistive memory, the programming circuit being configured to:

a) apply, based on a target resistive state, an initial resistance modification to a first cell of the resistive memory to change the resistance of the first cell from an initial resistive state to a first new resistance;

b) compare the first new resistance of the first cell with a first resistance range of the first target resistive state, the first resistance range being defined by low and high resistance thresholds;

c) if the first new resistance is below the low resistance threshold, apply at least one further resistance modification to the first cell to increase its resistance; and d) if the first new resistance is above the high resistance threshold, apply by the programming circuit at least one further resistance modification to the first cell to reduce its resistance.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
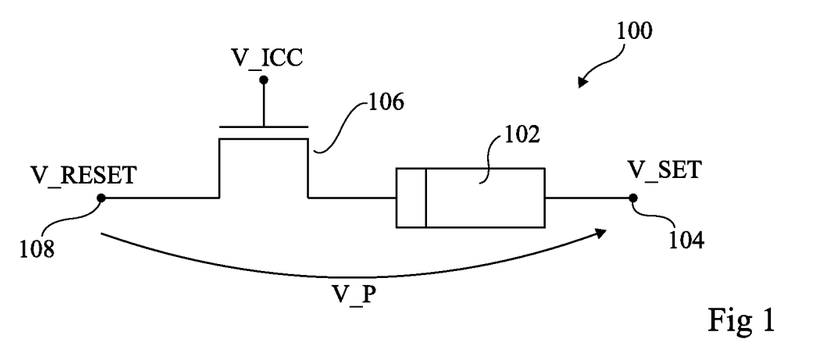
FIG. 1 schematically illustrates a 1T1R resistive memory cell according to an example embodiment.

FIG. 1 schematically illustrates a resistive memory cell 100 according to an example embodiment in which the memory cell 100 is a 1T1R (one transistor, one resistor) cell. The cell 100 comprises a variable resistance element 102, which is for example an element based on a metal-insulator-metal (MIM) structure, such as an OxRAM element, where the insulator is for example an oxide, for example comprising $HfO_2$, $Ta_2O_5$, or $SiO_2$. In the example of FIG. 1, the element 102 has two terminals, one being connected to an input/output node 104 of the cell 100 receiving a voltage V_SET, and the other being coupled via the main conducting nodes of a transistor 106 to an input/output node 108 of the cell 100 receiving a voltage V_RESET. A control node of the transistor 106 for example receives a control voltage V_ICC.

To program the cell 100, a programming voltage V_P is applied between the input/output nodes 104, 108, and the control voltage V_ICC is applied to the control node of the transistor 106 in order to generate a current through the element 102. Depending on the type of resistive element 102, its resistive state is programmed by the level of this current and/or of the voltage V_P.

In the present disclosure, bringing the resistance of a memory cell to its highest resistive state will be referred to a resetting the cell, and bringing the resistance of a memory cell to another of its resistive states will be referred to as setting the cell. In the example of FIG. 1, the cell 100 is reset when the voltage V_RESET is higher than the voltage V_SET, and is set when the voltage V_SET is higher than the voltage V_RESET. The control voltage V_ICC is for example always positive with respect to the voltages V_SET and V_RESET, in other words it is higher than the lowest of the voltages V_SET and V_RESET.

Figure 2:
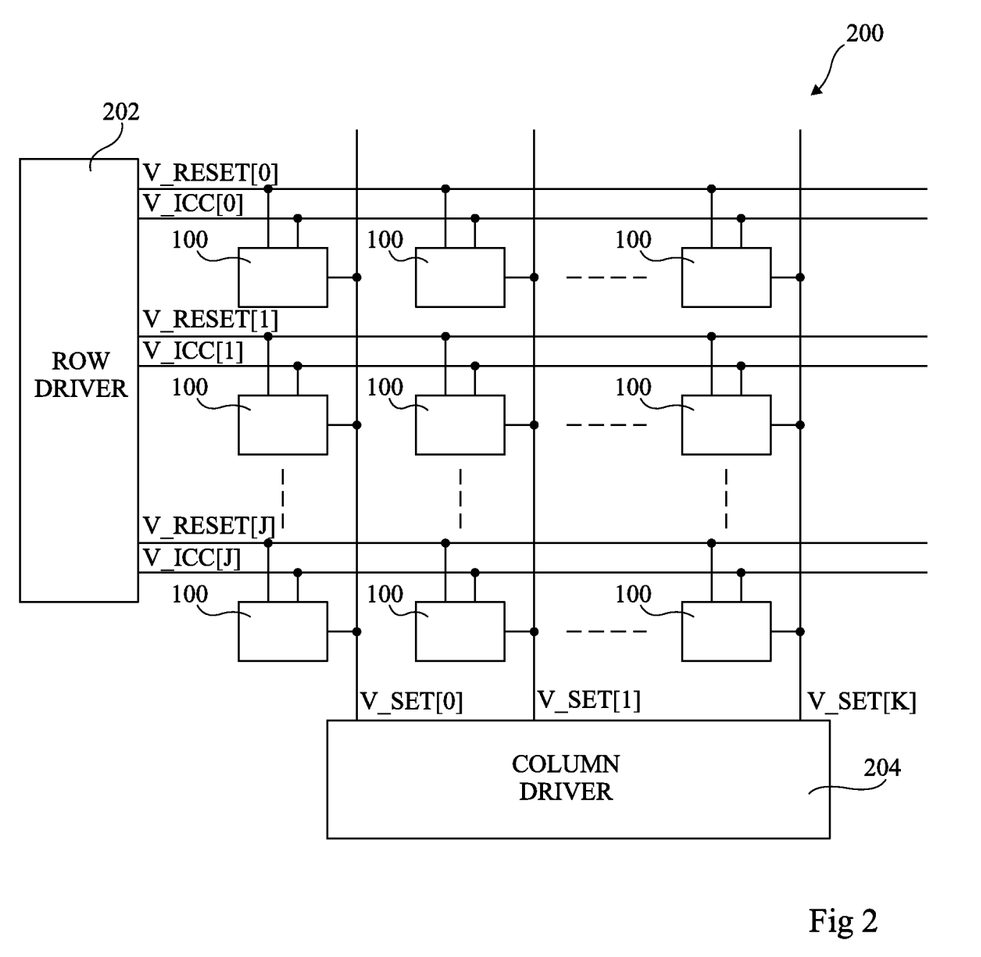
FIG. 2 schematically illustrates a resistive memory according to an example embodiment based on 1T1R cells.

FIG. 2 schematically illustrates a resistive memory 200 according to an example embodiment. The memory 200 for example comprises an array of the memory cells 100 of FIG. 1 arranged in rows and columns. A row driver (ROW DRIVER) 202 for example supplies the voltages V_RESET and V_ICC to the cells 100 of the array, and for example supplies these voltages on common row lines V_RESET[0] to V_RESET[J] and V_ICC[0] to V_ICC[J], respectively shared by the cells of the rows 0 to J of the array. The number J of rows is for example equal to at least two.

A column driver (COLUMN DRIVER) 204 for example supplies the voltage V_SET to the cells 100 of the array, and for example supplies this voltage on common column lines V_SET[0] to V_SET[K] respectively shared by the columns 0 to K of the array. The number K of columns is for example equal to at least two.

The row and column drivers 202, 204 together form a programming circuit of the memory array capable of programming the resistive state of each memory cell 100.

While FIGS. 1 and 2 relate to 1T1R cells, in alternative embodiments the resistive memory 200 could be implemented as a cross-bar array in which the transistor 106 of each memory cell is replaced by a two terminal selector element. In such a case, each cell has only two terminals, and it is the row driver 202 that for example applies the programming voltage/current during write operation.

Furthermore, while in the example of FIGS. 1 and 2 each memory cell comprises a variable resistance element that is programmed based on a polarity of the voltage/current applied to its terminals, in alternatively embodiments, the variable resistance elements could be unipolar elements that use the same voltage polarity for set and reset programming operations.

Figure 3:
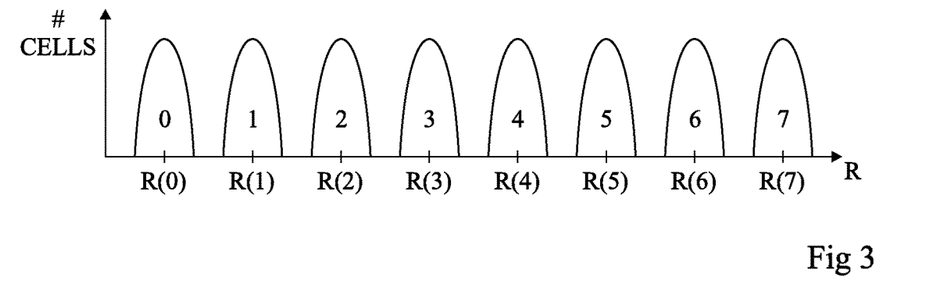
FIG. 3 is a graph representing programmable resistive states of a resistive element according to an example embodiment.

FIG. 3 is a graph representing programmable resistive states of a resistive element according to an example embodiment. The x-axis of the graph represents the resistance R using a log scale and the y-axis represents the number of cells (#CELLS). The example of FIG. 3 corresponds to 3-bit memory cells in which the variable resistance element of each cell is programmable to have one of 8 resistive states labeled 0 to 7 in the example of FIG. 3. The resistances of the variable resistance elements programmed within each resistive state n are distributed around a mean level R(n), for example according to a normal distribution. Thus, the resistances associated with each resistive state fall within a corresponding resistance range. In some embodiments, there is a gap between the resistance ranges of adjacent resistive states to facilitate the read operation. Alternatively, redundancy in the programmed data may allow the resistance ranges to have little or no gap between them.

According to one example, the resistance R(0) has an order of magnitude of 100 to 10,000 ohms, and the resistance R(7) has an order of magnitude of $10^7$ to $10^9$ ohms.

Figure 4:
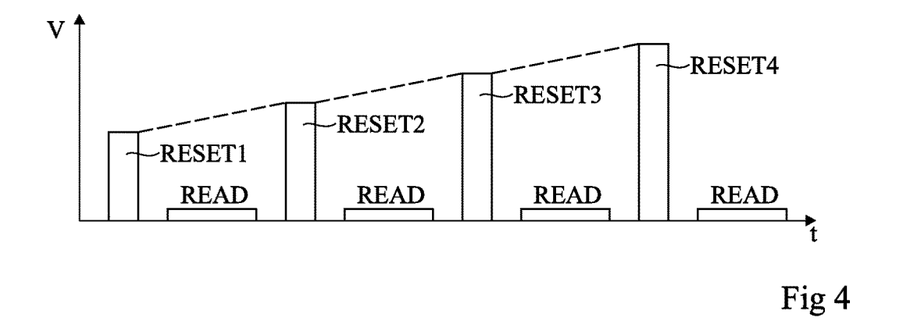
FIG. 4 is a graph representing an incremental step pulse programming (ISPP) method according to an example embodiment.

FIG. 4 is a graph representing an incremental step pulse programming (ISPP) method similar to methods used for programming a flash memory, and that could be applied for programming cells of a resistive memory according to an example embodiment.

Initially it is assumed that a cell is at a SET state such as the state 0 of FIG. 3, and the targeted state is for example the state 1. According to the method of FIG. 4, a reset voltage pulse RESET1 is applied to a memory cell. For example, this pulse is applied as the signal V_ICC at the control node of the transistor 106 of the cell 100 of FIG. 1, while voltage V_RESET is at a higher level than the voltage V_SET.

After the pulse RESET1, a read operation is performed to detect whether the resistance of the cell has increased sufficiently for it to have passed the lower limit of the resistive state 1. If so, the programming of this cell is complete. If not, a further pulse RESET2 of higher amplitude than the pulse RESET1 is applied to the cell, and a further read operation is performed, and it is again verified whether the lower limit of the state 1 has been exceeded. If so, the programming of this cell is complete. If not, these operations are repeated again and again until it is determined that the lower limit of the target state has been exceeded.

The increments in the amplitude of the reset pulses are for example chosen such that the corresponding change in resistance will be lower than the resistance range of the targeted state, and as such, there is low risk of overshooting the targeted state. However, this leads to a relatively slow process for bringing a cell to the desired target state.

Figure 5:
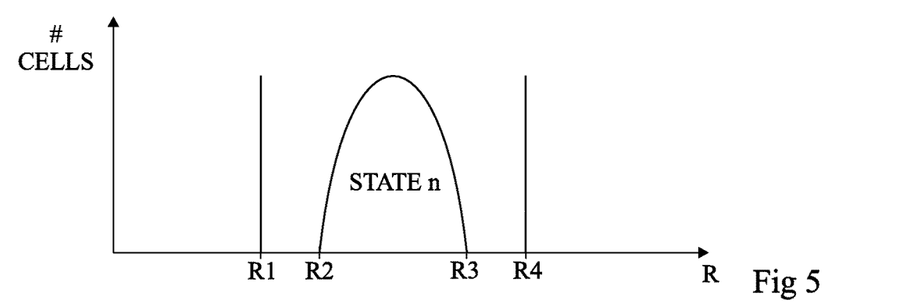
FIG. 5 is a graph representing resistance thresholds associated with a resistive state according to an example embodiment.

FIG. 5 is a graph representing resistance thresholds associated with a resistive state according to an example embodiment of the present disclosure. Like in the example of FIG. 3, the x-axis (resistance R) of the graph of FIG. 5 uses a log scale. A curve in FIG. 5 represents the distribution of cells in a resistive memory having a state n, where n is for example from 0 to 7 in the case of 3-bit memory cells, or more generally from 0 to M−1, where there are M states, and M is an integer equal to 2 or more.

For each state n, four resistance thresholds R1, R2, R3 and R4 are for example defined. However, in some embodiments, only the thresholds R3 and R4 are defined for the lowest resistive state 0, and only the thresholds R1 and R2 are defined for the highest resistive state M−1.

The thresholds R2 and R3 are for example respectively low and high resistance thresholds defining lower and upper limits of the resistance distributions in the state n. In other words, the low threshold R2 corresponds to the low end of the resistance range of the state n, and the high threshold R3 corresponds to the high end of the resistance range of the state n.

The thresholds R1 and R4 define a target resistance range associated with the state n, as will be described in more detail below. The threshold R1 is lower than the threshold R2 defining the lower limit of the state n, and the threshold R4 is higher than the threshold R3 defining the upper limit of the state n.

In some embodiments, the threshold R2 is at least 10 percent greater than the threshold R1, and the threshold R4 is at least 10 percent greater than the threshold R3.

In other embodiments, the threshold R2 is at least twice the threshold R1, and the threshold R4 is at least twice the threshold R3.

In yet further embodiments other embodiments, the threshold R2 is at least ten times the threshold R1, and the threshold R4 is at least ten times the threshold R3.

According to the embodiments described herein, during the programming operation of each cell of a resistive memory, the programmed resistance is compared with one or both of the thresholds R2 and R3, and with one or both of the thresholds R1 and R4. An example of a comparator for performing such a comparison between a programmed resistance and a resistance threshold will now be described with reference to FIG. 6.

Figure 6:
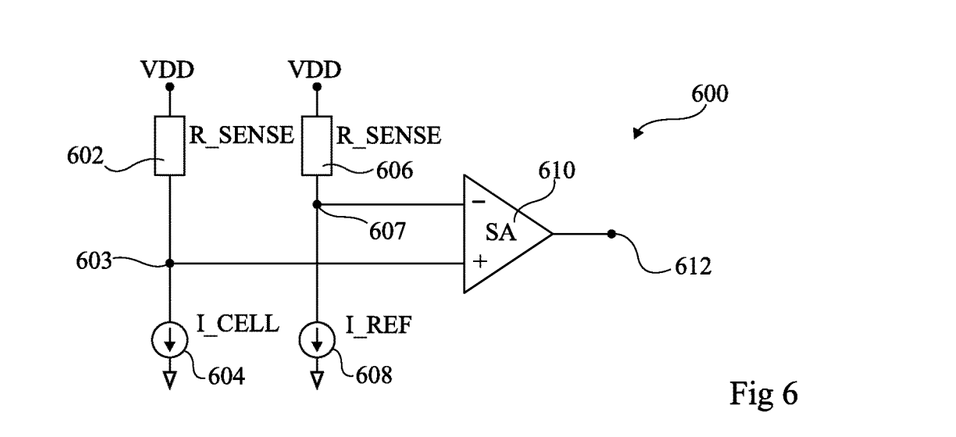
FIG. 6 schematically illustrates a resistance comparator according to an example embodiment.

FIG. 6 schematically illustrates a resistance comparator 600 according to an example embodiment.

An input branch for example comprises a resistor 602 of resistance R_SENSE coupled between a supply rail VDD and an intermediate node 603. The node 603 is in turn coupled to the cell having the resistance to be compared. This cell is represented by a current source 604 in FIG. 6 conducting a current I_CELL during a read operation of the cell to be compared.

A reference branch for example comprises a resistor 606 having the same resistance R_SENSE as the resistor 602 and coupled between the supply rail VDD and an intermediate node 607. The node 607 is in turn coupled to a reference cell having the threshold resistance. This reference cell is represented by a current source 608 in FIG. 6 conducting a current I_REF. For example, the resistance of this reference cell corresponds to one of the threshold resistances R1, R2, R3 and R4 of a given state n.

The intermediate nodes 603 and 607 are for example respectively coupled to positive and negative inputs of a sense amplifier (SA) 610, which provides at its output 612 a signal indicating when the current I_CELL is lower than the current I_REF, indicating that the resistance of the cell to be compared is higher than the threshold resistance.

In some embodiments, a comparator similar to the one of FIG. 6 is provided for each of the resistance thresholds R1 to R4 for each of the states n. In some embodiments there may however be some common thresholds among the various states. These comparators for example form part of the programming circuit of the resistive memory. For example, they could be implemented in the row driver 202 of FIG. 2.

Figure 7:
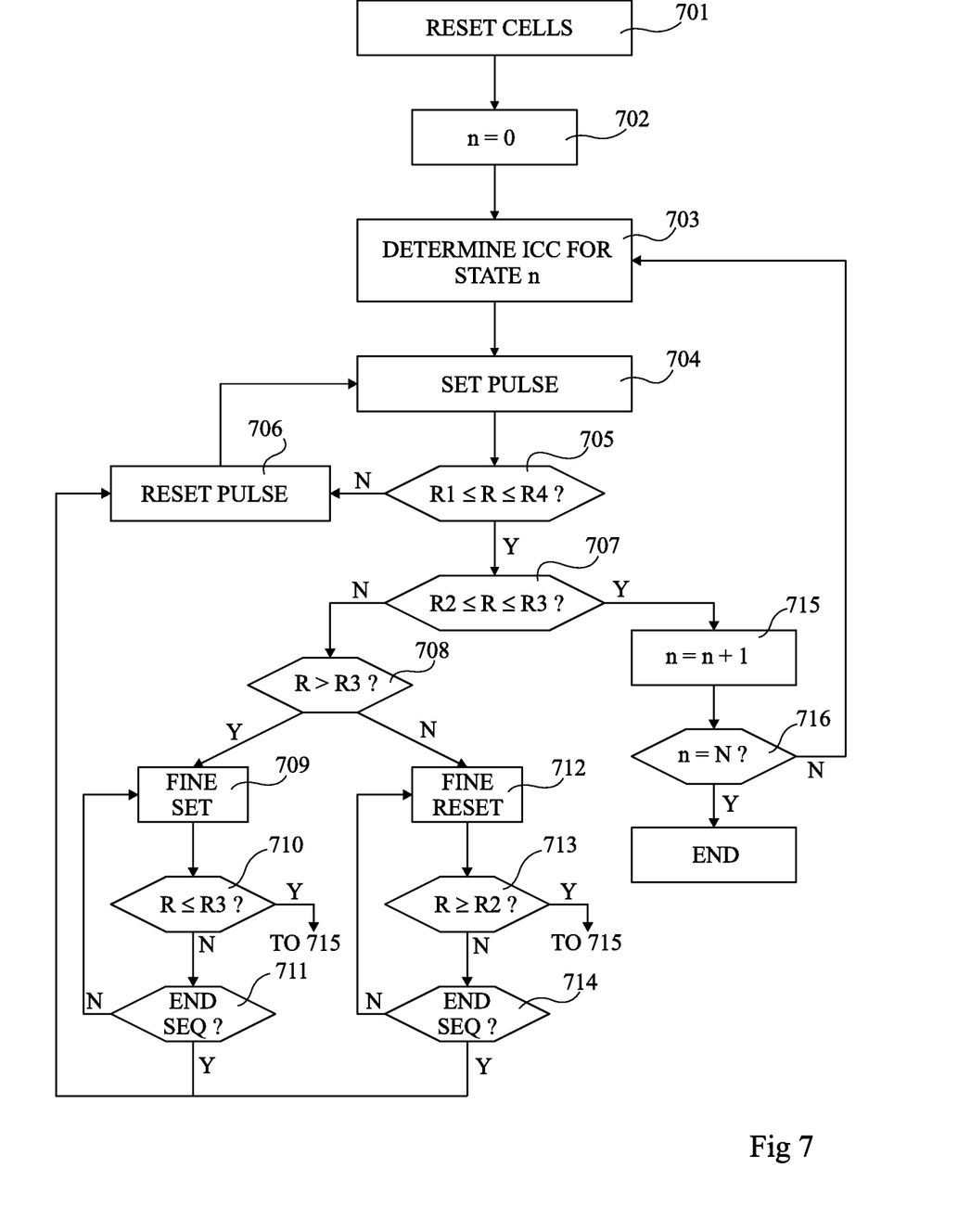
FIG. 7 is a flow diagram representing operations in a method of programming one or more cells of a resistive memory according to an example embodiment.

FIG. 7 is a flow diagram representing operations in a method of programming one or more cells of a resistive memory array according to an example embodiment. This method is for example implemented by a programming circuit of a resistive memory, such as by the row and column drivers 202, 204 of FIG. 2 and by resistance comparators like the comparator 600 of FIG. 6.

The method of FIG. 7 will be described assuming that the resistive states of FIG. 3 are to be programmed. This method could however be used to program memory cells having two or more states.

In an operation 701, the cells of the resistive memory are for example brought to an initial state, which is for example the highest or lowest resistive state. In some embodiments, this is performed by a SET or RESET operation of all the cells, the operation that is most energy consuming being used. Indeed, this can allow the subsequent operations, which take more time, to use less energy. Alternatively, the operation that is the most time consuming could be used, as this can allow subsequent operations, which are more numerous, to be performed more quickly. In the example of FIG. 7, an operation is applied to bring all of the cells to the highest resistive state. For example, a reset operation is used to bring all of the cells to the state 7 of FIG. 3.

In an operation 702, a variable n representing the state is set to a first target state to be programmed. In the example of FIG. 7, the first target state is the state 0. However, other orders would be possible. In some embodiments, if the initial state of the memory cells is the highest resistive state (the state 7 in the example of FIG. 3), the first state to be programmed is the state 0, and if the initial state of the memory cells is the lowest resistive state 0, the first state to be programmed is the highest resistive state (the state 7 in the example of FIG. 3).

In an operation 703, a concurrence current ICC for programming the state n is determined, which on the first iteration is the state n=0. For example, the programming circuit includes a lookup table indicating, for each state n, the voltage level of the voltage V_ICC that should be applied to a cell in order to reach a target resistance range associated with the state n.

In an operation 704, a SET pulse is applied in order to reduce the resistance of one or more cells to the target resistive state n, which is initially the state 0. This corresponds to a coarse resistance control, which is aimed at bringing the cells directly to a resistance within or close to the range of the targeted state.

In an operation 705, the programmed resistance R of each of the programmed cells is for example compared with the resistance thresholds R1 and R4 of the state n, or only the threshold R4 in the case of the state 0, or only the threshold R1 in the case of the highest resistive state (the state 7 in the example of FIG. 3). If the resistance R of any cell is lower than R1 or higher than R4, then that cell has not reached the target range associated with the state n. In such a case, a new attempt is for example made to bring that cell to the target range of state n. For example, this involves applying a reset pulse in an operation 706 to reset the cell to state 7, and then repeating operations 704 and 705. In some embodiments, a limit is set on the number of times the loop formed of operations 704, 705 and 706 is executed for a given cell. For example, once a certain limit, such as one hundred attempts, has been reached, the cell is deemed faulty, and no longer used.

When in operation 705 it is determined that the resistance R of all the programmed cells is greater than or equal to R1 and less than or equal to R4, the next operation is 707.

In operation 707, it is determined whether the resistance R of each programmed cell falls within the resistance range of the state n, in other words whether it is equal to or greater than R2 and equal to or less than R3, or in the case of state 0, just less than or equal to R3, or in the case of the highest resistive state (the state 7 in the example of FIG. 3), just equal to or greater than R2. If not, a fine resistance control sequence is for example applied to each cell not falling within this range. This sequence is for example similar to the method of FIG. 4, except that the starting point of the resistance of each memory cell will already be relatively close to the resistance range of the targeted state, and therefore the sequence will be relatively rapid. Furthermore, in some embodiments, the fine resistance control sequence involves applying a voltage V_ICC pulse at the level determined in operation 703 for the state n, while the voltage V_P is adjusted in order to increase or decrease the programmed resistance of the concerned cells.

The fine resistance control method for example involves an operation 708 in which it is determined whether the resistance of the cell is above or below the resistance range of the state n. This is for example determined by comparing the resistance R of the cell with the resistance threshold R3, although it could equally be performed by comparing the resistance R of the cell with the resistance threshold R2.

If in operation 708 the resistance R is greater than R3, a fine set operation is performed in an operation 709. This for example involves reducing the resistance by a relatively fine variation. In some embodiments, this relatively fine variation is equal to or less than (R4−R3)/2, and in some cases equal to or less than (R4−R3)/10, where R3 and R4 are for example the values for the current state n, or the median values among all the states. Additionally or alternatively, the relatively fine variable is an amount less than the resistance range of the state n, i.e. R3-R2.

Then, in an operation 710, it is determined whether the resistance R is now less than or equal to the resistance threshold R3. If not, in an operation 711, it is determined whether the end of the fine resistance control sequence has been reached, in other words whether all available voltage levels have been applied. If not, the operations 709, 710 and 711 are repeated with the next voltage increment to reduce the resistance by the relatively fine variation, until the resistance R is equal to or less than the threshold R3, or the end of the fine resistance control sequence is reached. If, in operation 710, the resistance R is found to be equal to or less than R3, the next operation is an operation 715. Alternatively, if in operation 711 the end of the sequence is reached, the method for example returns to the operation 706.

If in operation 708 the resistance R is not greater than R3, a fine reset operation is performed in an operation 712. This for example involves increasing the resistance by a relatively fine variation. In some embodiments, this relatively fine variation is equal to or less than (R2−R1)/2, and in some cases equal to or less than (R2−R1)/10, where R1 and R2 are for example the values for the current state n, or the median values among all the states. Additionally or alternatively, the relatively fine variable is an amount less than the resistance range of the state n, i.e. R3-R2.

Then, in an operation 713, it is determined whether the resistance R is now greater than or equal to the resistance threshold R2. If not, in an operation 714, it is determined whether the end of the fine resistance control sequence has been reached, in other words whether all available voltage levels have been applied. If not, the operations 712, 713 and 714 are repeated with the next voltage increment to increase the resistance by the relatively fine variation, until the resistance R is equal to or greater than the threshold R2, or the end of the fine resistance control sequence is reached. If, in operation 713, the resistance R is found to be equal to or greater than R3, the next operation is an operation 715. Alternatively, if in operation 714 the end of the sequence is reached, the method for example returns to the operation 706.

When the resistance range of the target state n has been reached in operation 707, 710 or 713, the next operation is 715, in which the variable n is incremented.

Then, in an operation 716, it is for example determined whether n is equal to its final level N. If not, the method for example returns to operation 703 based on the new state n. If all of the states have been programmed, the method for example ends.

While in the example of FIG. 7 the coarse resistance control is performed based on a state dependent retry method, whereby if unsuccessful, reset and set (or set and reset) operations are repeated, in alternative embodiments, an incremental compliance current method could instead be applied, in which, similar to the ISPP method, the voltage V_ICC is increased in increments until the target range between the thresholds R1 to R4 is reached. In some embodiments, a combination of the state dependent retry method and the incremental compliance current method can be used, as will now be described with reference to FIG. 8.

Figure 8:
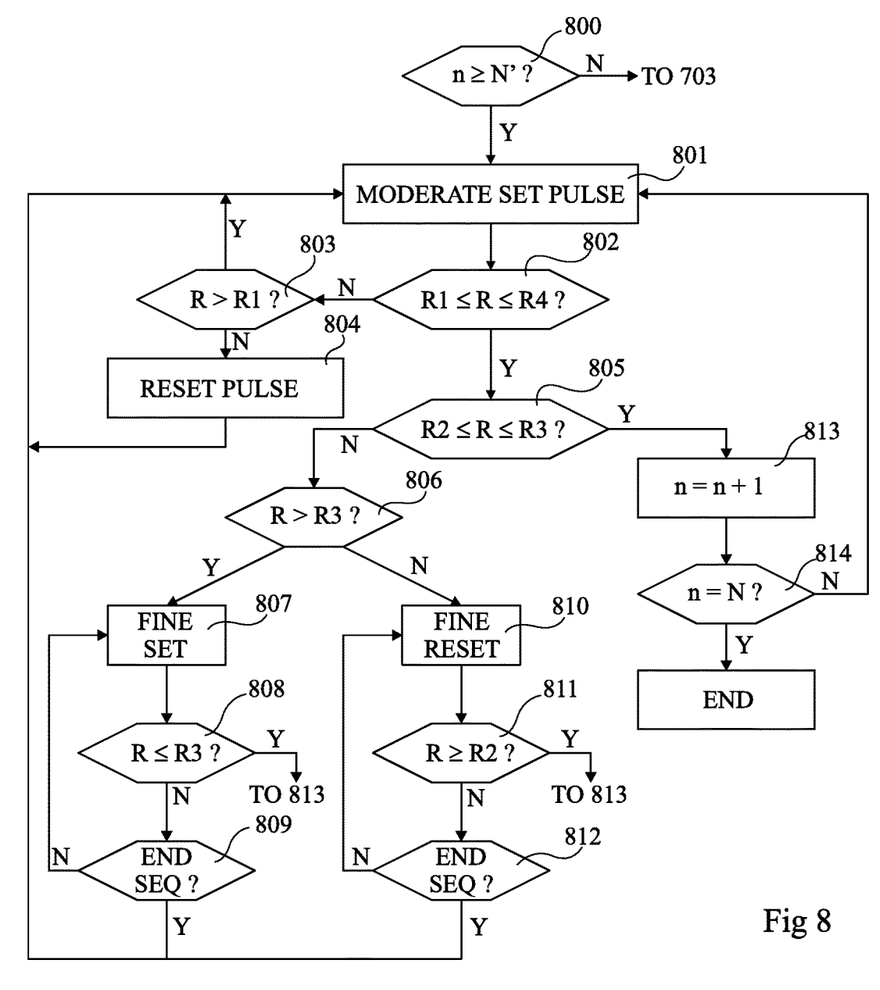
FIG. 8 is a flow diagram representing operations in a method of programming one or more cells of a resistive memory according to a further example embodiment.

FIG. 8 is a flow diagram representing operations in a method of programming one or more cells of a resistive memory according to a further example embodiment. The method of FIG. 8 is for example performed instead of the operation 716 of FIG. 7.

In an operation 800, the variable n is compared to a variable N', which is for example an intermediate state between the further state and the initial state. Assuming that the initial state is state 7 and programming starts with state 0, the state N' is for example the state 3, 4 or 5. Until the variable n reaches N', the method for example returns from operation 800 to operation 703 of FIG. 7. Once n is equal to N', an operation 801 of FIG. 8 is performed.

In operation 801, the set pulse is moderated, for example based on the ISPP method. On a first iteration, this for example involves applying an initial pulse using a first voltage level of the signal V_ICC to the cells to be programmed.

In an operation 802, the programmed resistance R of each of the programmed cells is for example compared with the resistance thresholds R1 and R4 of the state n, or only the threshold R1 in the case of the highest resistive state (the state 7 in the example of FIG. 3). If the resistance R of any cell is lower than R1 or higher than R4, then that cell has not reached the target range associated with the state n. In such a case, a new attempt is for example made to bring that cell to the target range of state n. This now involves repeating the operation 801 based on the next current increment, achieved for example by incrementing the voltage level of V_ICC. In some embodiments, before repeating operation 801, an operation 803 is implemented in which the programmed resistance R is compared to R1, and if R is not greater than R1, prior to repeating operation 801, a reset pulse is applied in an operation 804. This for example avoids a situation in which the target resistance range of the target state is exceeded, and the operation 801 modifies the resistance in the wrong direction. Operations 801 and 802 are then repeated until the resistance falls within the target range defined by the threshold R1 and/or R4 of the state n. Once this range has been reached, operations 805 to 814 are performed for each cell, these operations being respectively the same as operations 707 to 716 of FIG. 7, and will not be described again.

Figure 9:
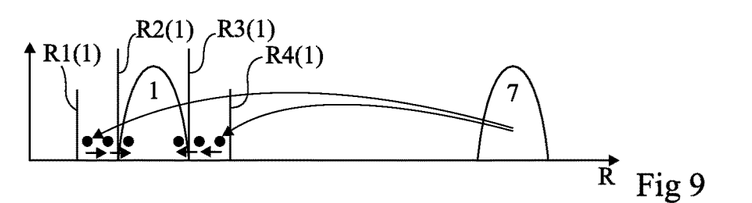
FIG. 9 is a graph representing the programming of a first memory cell according to the method of FIG. 7.
Figure 10:
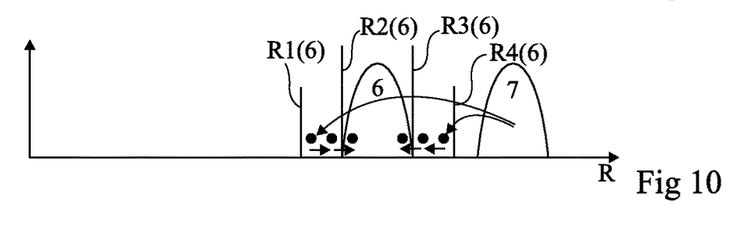
FIG. 10 is a graph representing the programming of a second memory cell according to the method of FIG. 8.

The principle applied according to the method of FIG. 8 is represented in FIGS. 9 and 10, as will now be described.

FIG. 9 is a graph representing the programming of a first memory cell according to the method of FIG. 7, for n less than N'. As illustrated, the cells to be programmed with the state 1 are brought from the state 7 to the target range of the state 1 defined by the thresholds R1(1) and R4(1) of the state 1. For cells having resistances falling outside the range R1(1) to R4(1), the state dependent retry method is applied. For cells having resistances falling within the range R1(1) to R4(1) but outside the range R2(1) to R3(1), the fine resistance control method is applied to bring the resistances within the range of the target state.

FIG. 10 is a graph representing the programming of a second memory cell according to the method of FIG. 8 for n equal to or greater than N'. As illustrated, the cells to be programmed with the state 6 are brought from the state 7 to the target range of the state 6 defined by the thresholds R1(6) and R4(6) of the state 6. For cells having resistances falling outside the range R1(6) to R4(6), the incremental compliance current method is applied. For cells having resistances falling within the range R1(6) to R4(6) but outside the range R2(6) to R3(6), the fine resistance control method is applied to bring the resistances within the range of the target state.

The methods described herein for programming the resistive states of cells of a resistive memory can be applied to any resistance ranges of the resistive states, with or without gaps between the ranges. In some embodiments, the resistance ranges are defined based on the techniques described in the publication entitled "Resistive RAM with multiple bits per cell: array-level demonstration of 3 bits per cell", Binh Le, A. Grossi, E. Vianello, T. Wu, G. Lama, E. Beignée, H-.S. Philip Wong, and Sabhasish Mitra, IEEE TED vol 66 no 1 Jan. 2019, the contents of which is hereby incorporated by reference to the extent permitted by the law. An example of the application of this technique will now be described with reference to FIG. 11.

Figure 11:
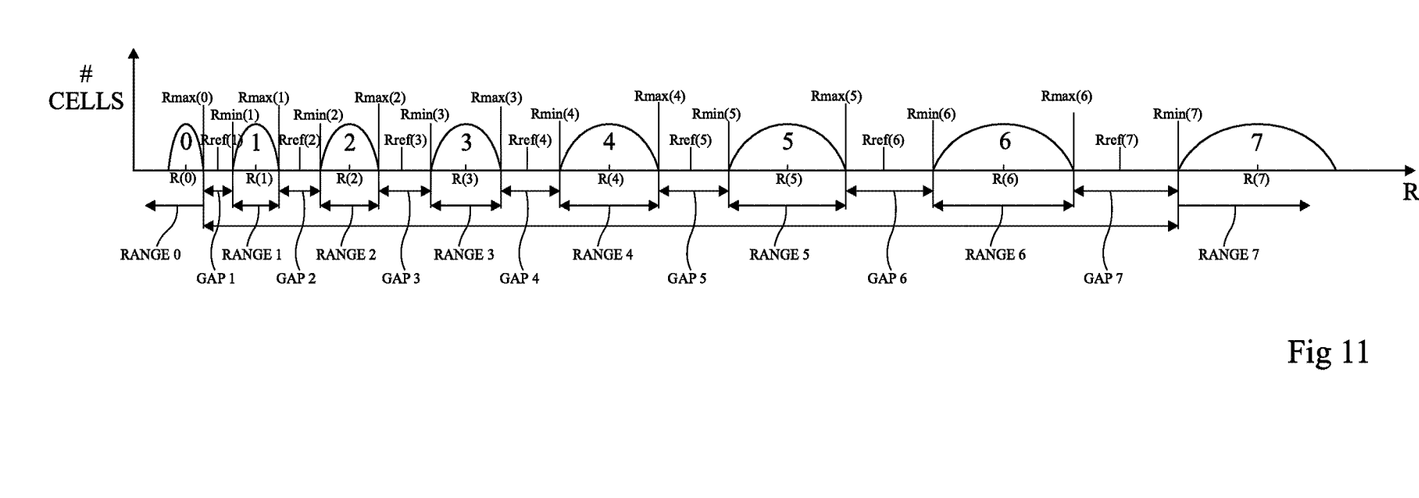
FIG. 11 is a graph representing a distribution of resistance ranges and gaps between ranges for a 3-bit cell according to an example embodiment.

FIG. 11 is a graph representing a distribution of resistance ranges and gaps between ranges for a 3-bit cell according to an example embodiment.

Key features of the solution represented by FIG. 11 include non-uniform gaps between resistance distributions, which are based on sense-amplifier sensing margin requirement; and non-uniform widths for resistance distributions, which are based on the intrinsic variation of RRAM memory cells. These key techniques for the distribution and sensing margin control for multi-bit per cell RRAM can lead to the optimum read and program performance, based on the fundamental differences between RRAM and threshold-based memory.

In some embodiments, the widths of distributions are multiples of standard variations. In other embodiments the widths of distributions are multiples of two or more standard variations. For example, for distribution 1, we can use 3 sigmas, but for distribution 7, we can use 2.5 sigmas.

For example, a method in a multi-bit per cell RRAM for dividing the available resistance window into ranges for multiple resistance distributions to improve read and program performance, comprises assigning non-uniform resistance ranges to multi-bit per cell RRAM distributions based on the intrinsic variation of RRAM memory cells; and assigning non-uniform gaps between the distributions based on sense-amplifier sensing margin requirement.

An advantage of the embodiments described herein is that the resistive states of cells of a resistive memory can be programmed in a relative fast and energy efficient manner.

Various embodiments and variants have been described. Those skilled in the art will understand that certain features of these embodiments can be combined and other variants will readily occur to those skilled in the art. For example, it will be apparent to those skilled in the art that while embodiments have been described based on 3-bit cells, the principled described herein could be applied to cells storing any number of bits.

Furthermore, while examples have been described herein based on 1T1R memory cells having three terminals, it will be apparent to those skilled in the art how the principles described herein could be applied to memory cells having only two terminals, such as 1S1R cells.

Further still, while examples have been described based on memory cells having variable resistance elements that are set and reset as a function of the polarity of the voltage applied across their terminals, it will be apparent to those skilled in the art how the techniques described herein could be applied to other types of variable resistance elements, such as unipolar elements.

What is claimed is:

1. A method of programming resistive memory cells of a resistive memory, the method comprising:
   a) applying, by a programming circuit based on a first target resistive state, an initial resistance modification to a first cell of the resistive memory to change the resistance of the first cell from an initial resistive state to a first new resistance;
   b) comparing, by the programming circuit, the first new resistance of the first cell with a resistance range of the first target resistive state defined by a high and/or low resistance threshold;
   c) comparing, by the programming circuit, the first new resistance of the first cell with a target resistance range associated with the first target resistive state and defined by a high and/or low resistance threshold; and d) if it is determined that the first new resistance is outside the resistance range of the first target resistive state and inside the target resistance range, applying by the programming circuit one or more further resistance modifications to the first cell to increase or decrease its resistance.

2. The method of claim 1, further comprising:
if the first new resistance is below the resistance range of the target resistive state, applying by the programming circuit in step d) at least one further resistance modification to the first cell to increase its resistance; and
if the first new resistance is above the resistance range of the target resistive state, applying by the programming circuit at least one further resistance modification to the first cell to reduce its resistance.

3. The method of claim 1, wherein each of the one or more further resistance modifications modifies the resistance of the first cell by less than:
half the difference between the low threshold of the target resistance range and the low resistance threshold of the first target resistive state; or
half the difference between the high resistance threshold of the first target resistive state and the high threshold of the target resistance range.

4. The method of claim 1, wherein the initial resistance modification modifies the resistance of the first cell by more than:
half the difference between the low threshold of the target resistance range and the low resistance threshold of the first target resistive state; or
half the difference between the high resistance threshold of the target resistive state and the high threshold of the target resistance range.

5. The method of claim 1, wherein if the first new resistance is within the resistance range of the target resistive state, no further resistance modification is applied to the first cell.

6. The method of claim 1, wherein the first cell comprises a first variable resistance element coupled in series with a first transistor, and wherein applying, by the programming circuit, the initial resistance modification to the first cell comprises:
applying a first programming voltage across the first variable resistance element; and
applying a control voltage at a first level to the first transistor, the first level being selected based on the first target resistive state.

7. The method of claim 6, comprising applying by the programming circuit, in operation d), at least one further resistance modification to the first cell by applying a second programming voltage across the first variable resistance element, the second programming voltage being at a different level to the first programming voltage.

8. The method of claim 1, wherein the resistance range of the first target resistive state is defined by the high resistance threshold and the low resistance threshold, and the target resistance range is defined by the high threshold and the low threshold, the low resistance threshold of the first target resistive state being higher than the low threshold of the target resistance range and the high threshold of the target resistance range being higher than the high resistance threshold of the target resistive state.

9. The method of claim 8, wherein the low resistance threshold of the first target resistive state is at least 10 percent higher than the low threshold of the target resistance range, and the high threshold of the target resistance range is at least 10 percent higher than the high resistance threshold of the first target resistive state.

10. The method of claim 1, further comprising:
e) applying, by the programming circuit based on a second target resistive state, an initial resistance modification to a second cell of the resistive memory to change its resistance from the initial resistive state to a second new resistance;
f) comparing, by the programming circuit, the second new resistance of the second cell with a second resistance range of the second target resistive state defined by a high and/or low resistance threshold;
g) comparing, by the programming circuit, the second new resistance of the second cell with a second target resistance range associated with the second target resistive state and defined by high and/or low resistance thresholds; and
h) if it is determined that the second new resistance is outside the resistance range of the second target resistive state and inside the second target resistance range, applying by the programming circuit one or more further resistance modifications to the second cell to increase or decrease its resistance.

11. The method of claim 10, wherein:
the first cell comprises a first variable resistance element coupled in series with a first transistor, and wherein applying, by the programming circuit, the initial resistance modification to the first cell comprises:
applying a first programming voltage across the first variable resistance element; and
applying a control voltage at a first level to the first transistor, the first level being selected based on the first target resistive state; and
the second cell comprises a second variable resistance element coupled in series with a second transistor, and wherein applying, by the programming circuit, the initial resistance modification to the second cell comprises:
applying a control voltage at a second level to the second transistor, the second level being different from the first level and being selected based on the second target resistive state.

12. The method of claim 10, further comprising:
determining that the first new resistance of the first cell is outside the first target resistance range and repeating the initial resistance modification; and
determining that the second new resistance of the second cell is outside the second target resistance range, and applying a further initial resistance modification.

13. A programming circuit for programming resistive memory cells of a resistive memory, the programming circuit being configured to:
a) apply, based on a first target resistive state, an initial resistance modification to a first cell of the resistive memory to change the resistance of the first cell from an initial resistive state to a first new resistance;
b) compare the first new resistance of the first cell with a resistance range of the first target resistive state defined by a high and/or low resistance threshold;
c) compare the first new resistance of the first cell with a target resistance range of the first target resistive state defined by a high and/or low resistance threshold; and
d) if it is determined that the first new resistance is outside the resistance range of the first target resistive state and inside the target resistance range, apply one or more further resistance modifications to the first cell to increase or decrease its resistance.

14. A resistive memory comprising:
an array of cells; and
the programming circuit of claim 13 configured to program the cells of the array.

15. The resistive memory of claim 14, wherein the cells of the array are each programmable to store a plurality of bits by programming one of three of more resistive states.

* * * * *